United States Patent
Peng et al.

(10) Patent No.: US 8,034,671 B2
(45) Date of Patent: Oct. 11, 2011

(54) POLYSILICON FILM, THIN FILM TRANSISTOR USING THE SAME, AND METHOD FOR FORMING THE SAME

(75) Inventors: Chia-Tien Peng, Hsinchu Hsien (TW); Chih-Hsiung Chang, Taichung Hsien (TW)

(73) Assignee: Au Optronics Corp., Hsin-Chu (TW)

( * ) Notice: Subject to any disclaimer, the term of this patent is extended or adjusted under 35 U.S.C. 154(b) by 609 days.

(21) Appl. No.: 11/314,004

(22) Filed: Dec. 22, 2005

(65) Prior Publication Data

US 2006/0141684 A1 Jun. 29, 2006

(30) Foreign Application Priority Data

Dec. 24, 2004 (TW) .............................. 93140572 A

(51) Int. Cl.
*H01L 21/84* (2006.01)

(52) U.S. Cl. ........ 438/150; 438/149; 438/151; 438/155; 438/482; 257/62; 257/64; 257/66; 257/E51.005

(58) Field of Classification Search .................. 438/149, 438/150, 151, 155, 482, FOR. 206; 257/E51.005, 257/E29.151, 62, 64, 66
See application file for complete search history.

(56) References Cited

U.S. PATENT DOCUMENTS

| | | | |
|---|---|---|---|
| 6,093,586 A | | 7/2000 | Gosain et al. |
| 6,201,279 B1 * | | 3/2001 | Pfirsch ........................... 257/333 |
| 2002/0110964 A1 * | | 8/2002 | Cheng et al. ................... 438/166 |
| 2002/0123218 A1 * | | 9/2002 | Shioya et al. .................. 438/635 |
| 2002/0160622 A1 * | | 10/2002 | Yamazaki et al. ............. 438/762 |
| 2003/0127709 A1 * | | 7/2003 | Lippmann et al. ............. 257/642 |
| 2003/0148565 A1 * | | 8/2003 | Yamanaka ..................... 438/200 |
| 2003/0155572 A1 | | 8/2003 | Han et al. |
| 2003/0174275 A1 * | | 9/2003 | Asano et al. .................. 349/187 |
| 2004/0058076 A1 * | | 3/2004 | Peng .......................... 427/376.2 |
| 2004/0121529 A1 | | 6/2004 | Sohn et al. |
| 2004/0127032 A1 * | | 7/2004 | Peng et al. ..................... 438/689 |
| 2004/0140468 A1 * | | 7/2004 | Liao et al. ........................ 257/52 |
| 2004/0175870 A1 * | | 9/2004 | Peng et al. ..................... 438/149 |
| 2004/0197968 A1 * | | 10/2004 | Peng et al. ..................... 438/154 |
| 2004/0219723 A1 * | | 11/2004 | Peng et al. ..................... 438/166 |
| 2005/0003568 A1 * | | 1/2005 | Yamazaki et al. .............. 438/30 |
| 2005/0127818 A1 * | | 6/2005 | Ohtani .......................... 313/500 |
| 2005/0161659 A1 * | | 7/2005 | Bakkers ........................... 257/9 |
| 2005/0236357 A1 * | | 10/2005 | Bakkers et al. .................... 216/2 |
| 2006/0234151 A1 * | | 10/2006 | Nakagawa et al. ............ 430/234 |

FOREIGN PATENT DOCUMENTS

JP 2001-274087 A 10/2001
TW 501286 B 9/2002

OTHER PUBLICATIONS

Shih-Ya Wu, Process Integation of Low-K Material with E-beam Lithography, pp. 1-3.

* cited by examiner

*Primary Examiner* — N Drew Richards
*Assistant Examiner* — Joannie A Garcia
(74) *Attorney, Agent, or Firm* — Birch, Stewart, Kolasch & Birch, LLP

(57) ABSTRACT

A crystallizing method for forming a poly-Si film is described as follows. First, forming an activated layer on a substrate, and the molecule structure of the activated layer includes carbon, hydrogen, oxygen and silicon. And then, forming an amorphous silicon film on the activated layer. Finally, performing an annealing process to crystallize the amorphous silicon film and transform it into a poly-Si film.

24 Claims, 9 Drawing Sheets

MSQ

US 8,034,671 B2

POLYSILICON FILM, THIN FILM TRANSISTOR USING THE SAME, AND METHOD FOR FORMING THE SAME

This application claims the benefit of Taiwan Application Serial No. 093140572, filed Dec. 24, 2004, the subject matter of which is incorporated herein by reference.

BACKGROUND OF THE INVENTION (1) Field of the Invention

The invention relates to a method for forming a poly-Si film though crystallizing an amorphous silicon film.

(2) Description of the Related Art

A poly-Si material has better attributes than an amorphous silicon material. Because of larger grain size, an electron is easier to move in the poly-Si material. That is, the mobility of the poly-Si material is higher than that of the amorphous silicon material. A transistor made of the poly-Si material has shorter reaction time than a transistor made of the amorphous silicon material. Comparing two liquid crystal displays at the same resolution, the one using a poly-Si TFT occupy less substrate area than the one using an amorphous silicon TFT, so that using the poly-Si TFT can increase the open ratio of the liquid crystal panel. Under the same brightness, the poly-Si TFT LCD can use a low-power backlight to reduce the power consumption. Therefore, the grain size of the poly-Si is an important factor affecting the efficiency of a TFT.

Presently, a poly-Si film is made on the substrate by Low Temperature Poly-Silicon (LTPS) process. The LTPS uses a excimer laser as a heat source. When the excimer laser irradiates on the substrate having an amorphous silicon film, the amorphous silicon film absorbs the energy of the laser to transform into the poly-Si film.

FIG. 1A and FIG. 1B shows a conventional method for manufacturing the poly-Si film. As shown in FIG. 1A, a nitride layer 11 is formed on a substrate 10. An oxide layer 12 is formed on the nitride layer 11. Subsequently, an amorphous silicon film 13 is formed on the oxide layer 12 by chemical vapor deposition (CVD) or sputtering. As shown in FIG. 1B, the amorphous silicon film 13 is irradiated by the excimer laser 15 to crystallize to form a poly-Si film 14. For acquiring larger grains, the energy of the excimer laser 15 should be able to almost completely melt the amorphous silicon film 13. Some non-melted grains remain on the interface between the oxide layer 12 and the amorphous silicon film 13. The melted amorphous film uses the non-melted grains as crystallization seeds to crystallize to form the poly-Si film 14.

However, the excimer laser is an pulse laser. The energy density of each pulse in the excimer laser is different from the other pulses. The larger energy density causes less amounts of crystallization seeds, and results in smaller grains and less homogeneity. According to the conventional method, the uncertain crystallizing direction makes it difficult to control the number and the location of the grain boundary. Under stable laser energy, it is necessary to reduce the crystallization energy and enlarge line beam size by an optical system to increase product output. Besides, more grain boundaries cause worse electrical characteristics of the poly-Si TFT.

To sum up, the conventional method is not capable of controlling the number and the location of the grain boundary, so that the crystallizing direction is uncertain, and it is not capable of reducing the laser energy requirement in the crystallization process, either. For reasons given above, the inventor submits a method for manufacturing the poly-Si film to improve the abovementioned disadvantages, and further, the method can be applied to manufacturing TFT.

SUMMARY OF THE INVENTION

Accordingly, the object of the invention is to provide a method for forming the poly-Si film to reduce the number of the grain boundaries, and to increase the grain homogeneity.

It is another object of the present invention to provide a process which uses an activated layer to reduce the crystallization energy in manufacturing a transistor.

It is a further object of the present invention to provide a transistor having a poly-Si channel of good quality to increase the mobility and the transmission.

To achieve the above objects, the method of the present invention is described as follows: first of all, forming an activated layer on a substrate, and the material of the activated layer includes carbon, hydrogen and silicon; subsequently, forming an amorphous silicon film on the activated layer; and, performing an annealing process for the amorphous film to transform into the poly-Si film.

The above crystallizing method is used to produce a transistor, which includes the activated layer forming on the substrate; a barrier layer covering on the activated layer; a poly-Si film forming on the barrier layer. And the poly-Si film includes a channel region on the overlap of the activated layer and the barrier layer, and a source region and a drain region respectively located two sides of the channel region. Besides, a gate insulating layer is formed on the poly-Si film, and is defined in the channel region. And a gate metal is formed on the gate insulating layer.

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 1A:
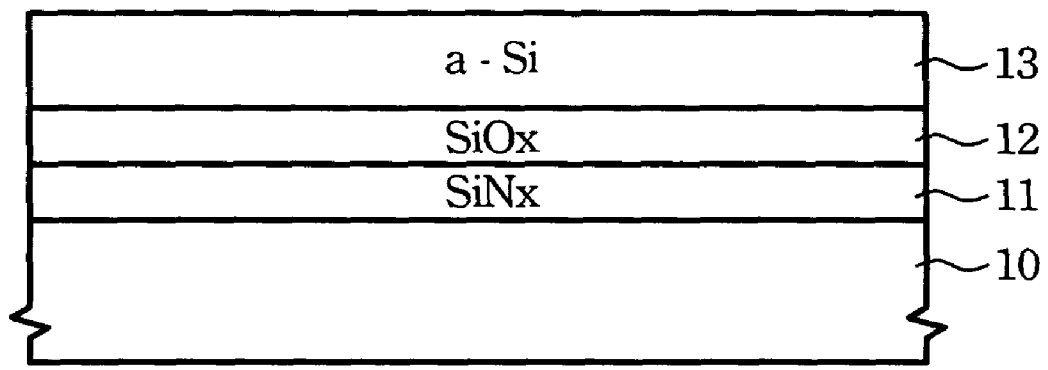
FIGS. 1A-1B are schematic view of a conventional method for manufacturing the poly-Si film.
Figure 1B:
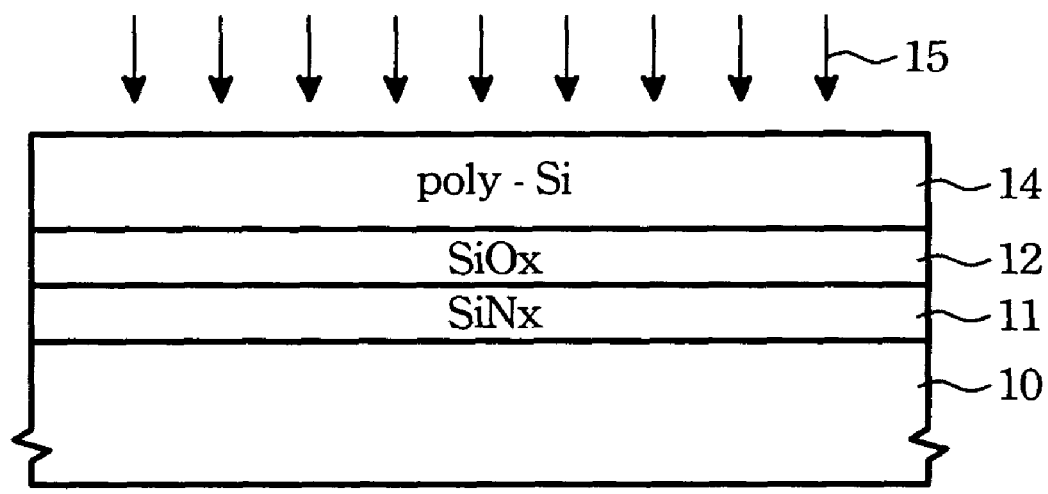
Figure 2A:
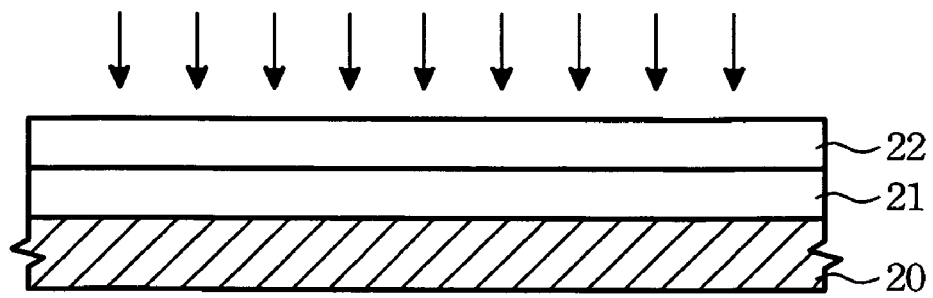
FIG. 2A is a basic structure adapting to a method of manufacturing a poly-Si film according to the present invention.
Figure 2B:
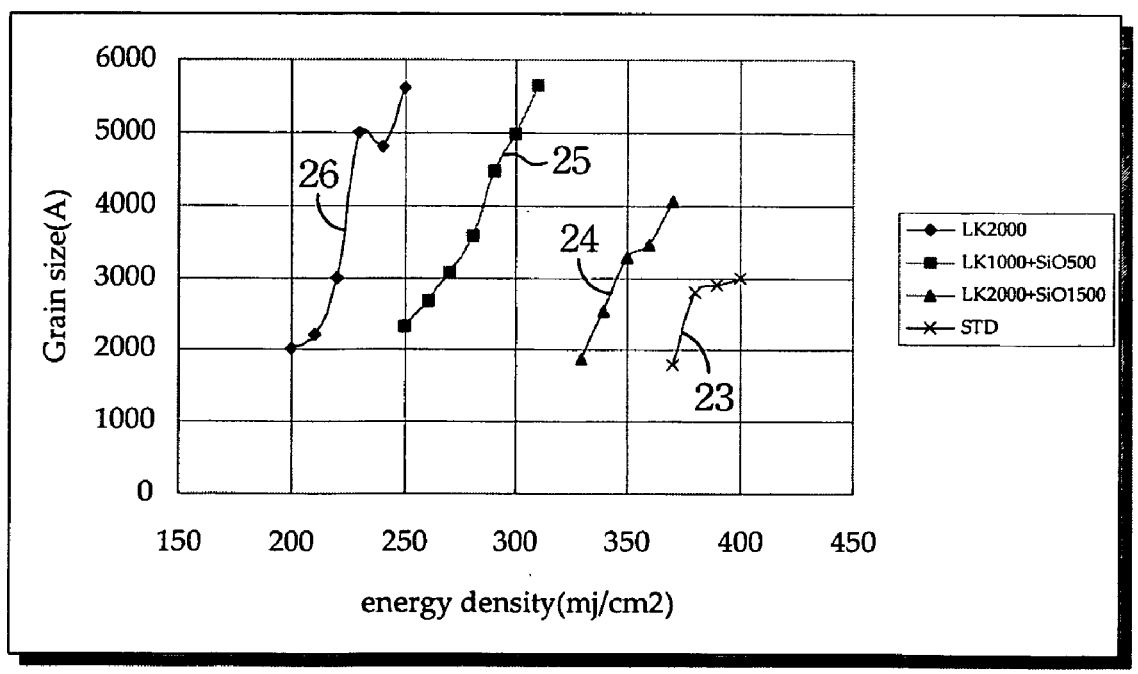
FIG. 2B is a curve about the grain size of the poly-Si versus the crystallization energy.

FIG. 2A shows the basic structure adapting to the method of manufacturing poly-Si film. For reducing crystallization energy, at least one activated layer 21 is positioned on a substrate 20, and an amorphous film 22 is positioned on the activated layer 21. After providing an annealing process for the amorphous silicon film 22, it crystallizes to form a poly-Si film. As shown in FIG. 2B, the grain size of the poly-Si is plotted versus the crystallization energy.

Refer to FIG. 2B, a curve 23 represents the relation of the grain size of the poly-Si versus the crystallization energy, and the poly-Si is formed by the laser irradiating a structure, which includes: substrate/SiN 500 Å/SiO 1500 Å/amorphous silicon film 500 Å arranged layer by layer. A curve 24 is a result of the laser irradiating the structure, which includes: substrate/activated layer 2000 Å/SiO 1500 Å/amorphous silicon film 500 Å arranged layer by layer. A curve 25 is a result of the laser irradiating the structure, which includes: substrate/activated layer 2000 Å/SiO 500 Å/amorphous silicon film 500 Å arranged layer by layer. A curve 26 is a result of the laser irradiating the structure, which includes: substrate/activated layer 2000 Å/amorphous silicon film 500 Å arranged layer by layer.

Comparing the curve 23 with the other three curves, the result illustrates under lacking activated layer, the higher laser energy is required and the grain size of the poly-Si is smaller than 3000 Å. Comparing the curve 24 with curve 25 and 26, the result illustrates that the thicker SiO layer has higher laser energy requirement, and results in the smaller grain size of the poly-Si. Comparing curve 23 with curve 26, the result illustrates that when the activated layer replaces the SiN, and contacts with the amorphous silicon film, the laser energy can be reduced 30-40%. It proves that the activated layer positioned under the amorphous silicon film can reduce the laser energy requirement.

Figure 2C:
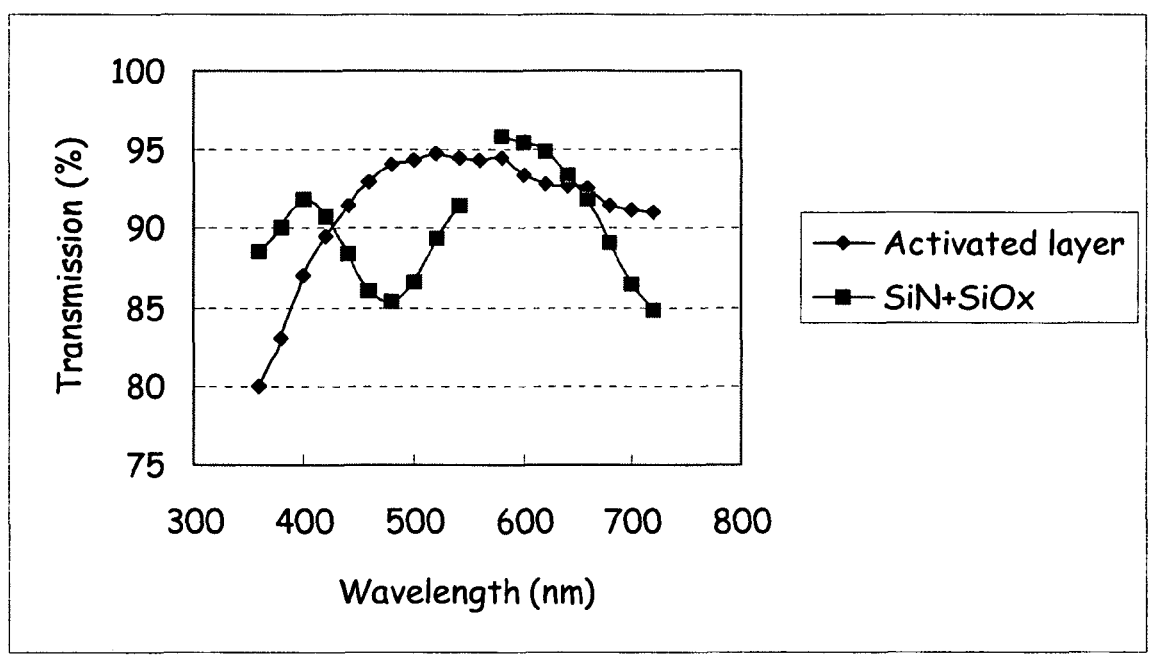
FIG. 2C is a light transmission curve of the activated layer and of the stacked SiN layer and SiOx layer.

A point worth emphasizing, in the manufacturing process of the thin film transistor, replacing SiN with the activated layer can improve the light transmission of the TFT. FIG. 2C shows that the light transmission of the visible light through the activated layer is higher than through the stacked SiN layer and SiOx layer.

Figure 3A:
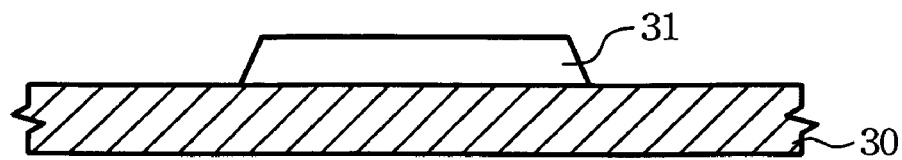
FIGS. 3A-3C are schematic view of the method for manufacturing the poly-Si film according the present invention.
Figure 3B:
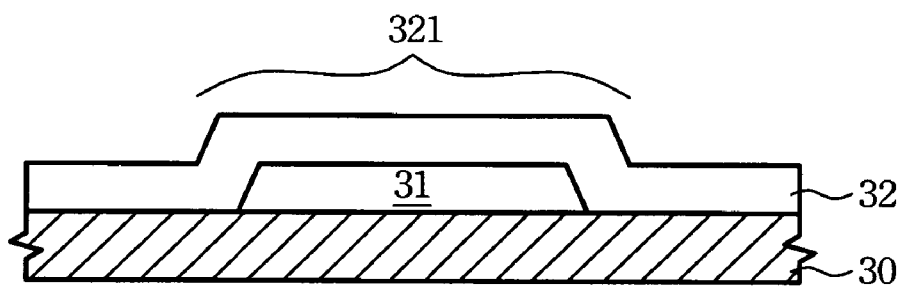
Figure 3C:
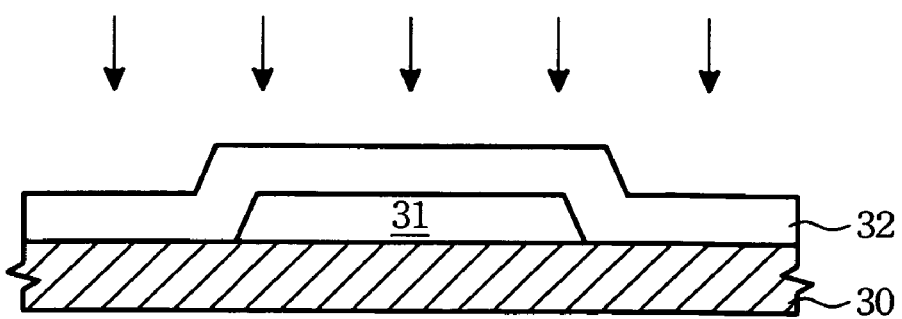

FIGS. 3A-3C are the schematic diagram of the method for producing poly-Si film. First of all, an activated layer 31 that is patterned is formed on a substrate 30, and the material of the activated layer 31 includes carbon, hydrogen and silicon, or includes a main structure consisting of SiOx and a branching structure consisting of carbon and hydrogen. Subsequently, an amorphous silicon film 32 is formed on the activated layer 31 and the substrate 30, and the overlap with the activated layer 31 is defined as a channel region 321. The next step is providing an annealing process for the amorphous film 32 to form a temperature gradient from inside to outside the channel region 321 for starting to crystallize. The energy of the annealing process is provided by a excimer laser. It is note that FIG. 2B indicates whether the activated layer 31 is patterned or not, it aid in reduction of the laser energy requirement during the crystallization course of the amorphous silicon film 32.

Figure 3D:
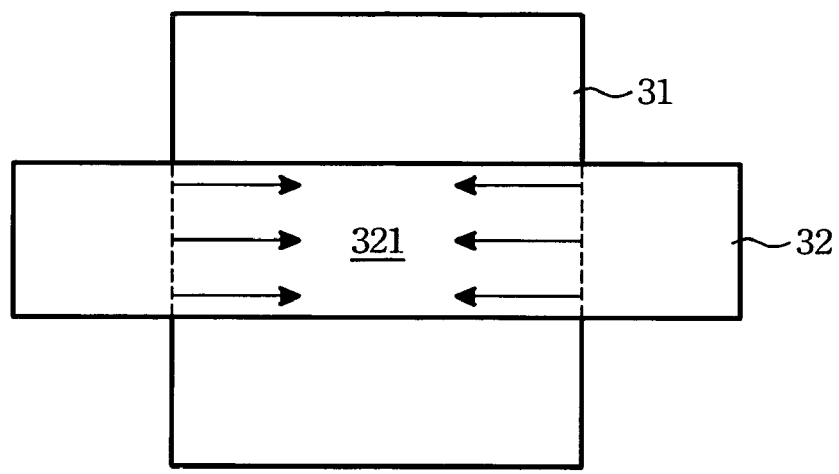
FIG. 3D is a top view of the structure shown in FIG. 3C.

FIG. 3D is a top view of the structure in FIG. 3C. During the crystallization course, the portion shown as a dashed line will generate the grain boundary. A temperature gradient is formed across the grain boundary (shown as a dashed line), so the grain boundary serves as a starting point for the crystallization. The grains grow from two sides to the central of the channel region 321. While the crystallization stopped, a stopping boundary is generated in the central of the channel region 321. Thus, the grains grow larger and more uniform due to the regular and centralized location of the grain boundary. Accordingly, the grain size is larger than 0.3 μm by the method of the present invention.

Figure 3E:
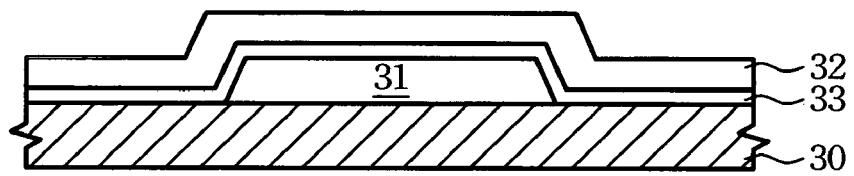
FIG. 3E is a barrier layer interposed between the activated layer and the amorphous silicon film according to the present invention.

Refer to FIG. 3E, based on the structure in FIG. 3A, a barrier layer 33 is formed before forming the amorphous silicon film 32 to prevent the activated layer 31 from the diffusing impurity or particles in the annealing process. And the material of the barrier layer 33 can be SiOx. Further, the barrier layer 33 may keep the heat when performing the following process, annealing or laser irradiating, for example.

Figure 3F:
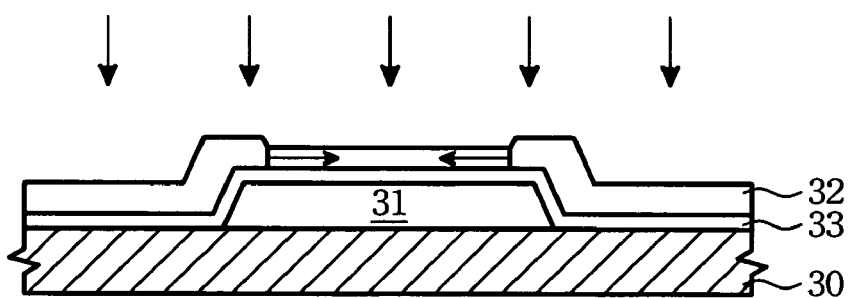
FIG. 3F is a schematic view of the amorphous silicon film defined by a shadow mask to reduce the thickness.

Refer to FIG. 3F, for more apparent temperature gradient and more efficient lateral crystallizing, a part of the amorphous silicon film 32 that is located on the activated layer 31 is removed to reduce its thickness, so that the thickness of the amorphous silicon film 32 inside the channel region 321 is thinner than outside the channel region 321. Note that the barrier layer 33 is not necessary for generating grains of good quality, controlling the direction of the crystallizing or for reducing the crystallization energy.

FIGS. 4A-4G show the method for producing the transistor in the present invention. The steps include: first of all, forming an activated layer 41 on a substrate 40; etching a part of the activated layer 41 by $O_2$ plasma to define a non-removal portion of the activated layer 41 in a predetermined region; and then, forming a barrier layer 42 on the activated layer 41 and on the substrate 40; subsequently, forming an amorphous silicon film 43 on the barrier layer 42. A part of the amorphous silicon 43 over the activated layer 41 is defined as a channel region 431 of the transistor. The two sides of the channel region 41 are respectively defined as a source region 432 and a drain region 433. Incidentally, the material of the barrier layer 42 can be SiOx.

The next step is providing an annealing process to form a temperature gradient from inside to outside the channel region 431. The temperature gradient results in crystallization from the two sides to the central of the channel region 431 to form a poly-Si film 44. After that, a gate insulating layer 45 is formed on the poly-Si film 44. Then, a gate metal 46 is formed on the gate insulating layer 45, and an insulating layer 49 forming on the gate metal 46. Two openings (not shown) are formed in the insulating layer 49 and respectively correspond to the source region 432 and the drain region 433. Finally, a source metal 47 is formed in the source region 432, and a drain metal 48 is formed in the drain region 433. The source metal 47 and the drain metal 48 are connected to the poly-Si film 44 through the two openings.

Figure 4A:
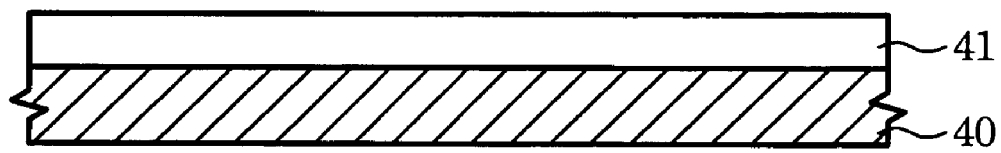
FIGS. 4A-4G are a method for manufacturing a transistor according to the present invention.
Figure 4B:
Figure 4C:
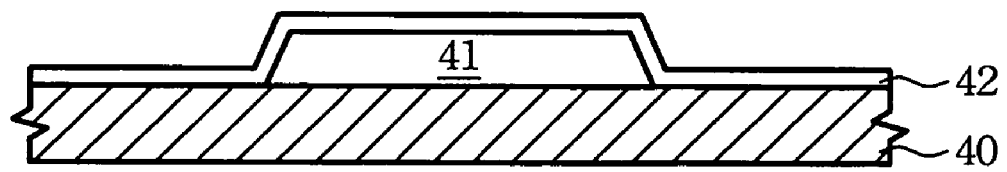
Figure 4D:
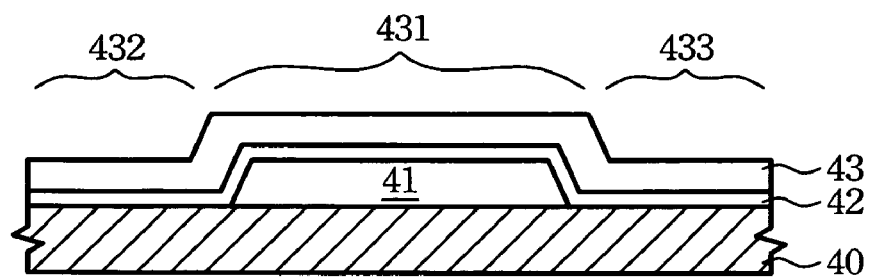
Figure 4E:
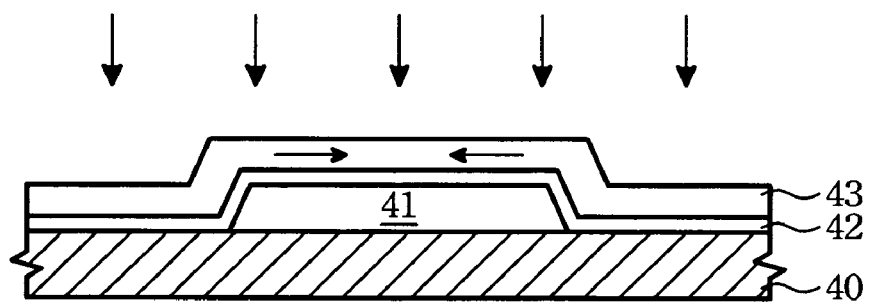
Figure 4F:
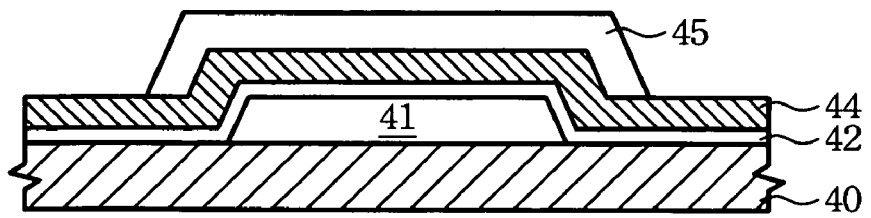
Figure 4G:
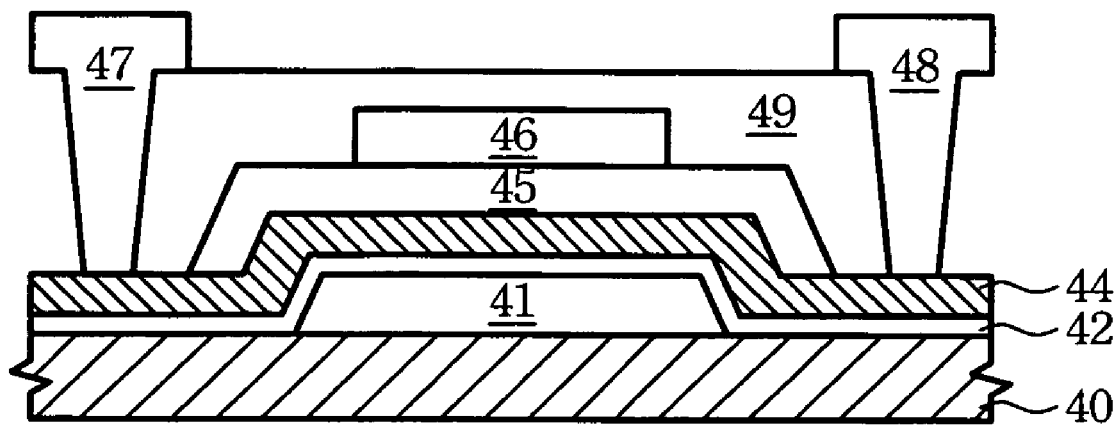
Figure 4H:
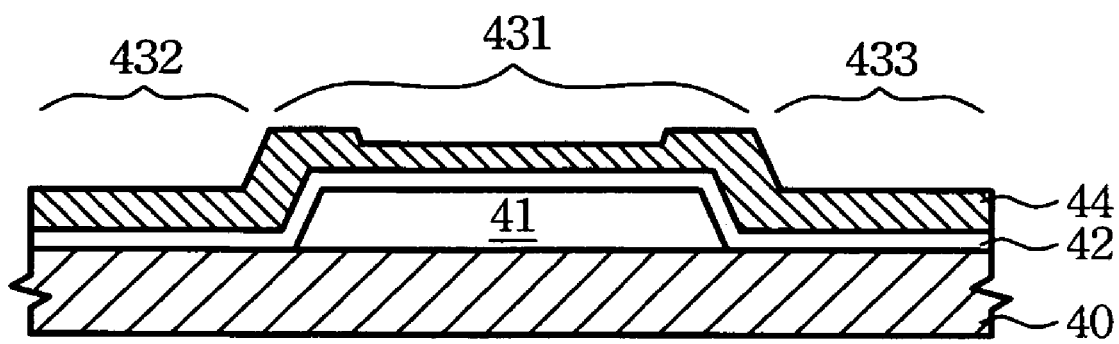
FIG. 4H is another schematic view of the amorphous silicon film defined by a shadow mask to reduce the thickness according to the FIG. 4E.
Figure 5:
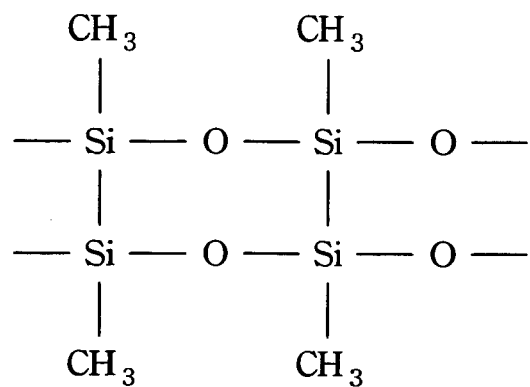
FIG. 5 is a structure of MSQ.

Based on the structure shown in FIG. 4E, a shadow mask is provided to make the amorphous silicon film 43 concave-down slightly to define the channel region 431 shown as FIG. 4H. Therefore, the amorphous silicon film 43 in the channel region 431 is thinner than in the source region 432 and in the drain region 433. Note that the activated layer is made of an organic material including oxygen atoms, silicon atoms or oxygen atoms and silicon atoms, such as MSQ, whose structure is shown as FIG. 5. The activate layer may also includes a main strain consisting of silicon oxide, and a branching strain consisting of carbon atoms and hydrogen atoms. Under greater than 450° C., MSQ still maintain thermal stable, so it can endure the high temperature of the excimer laser. In the annealing process, the excimer laser can provide an energy density of 200 to 400 mj/cm2.

Figure 6:
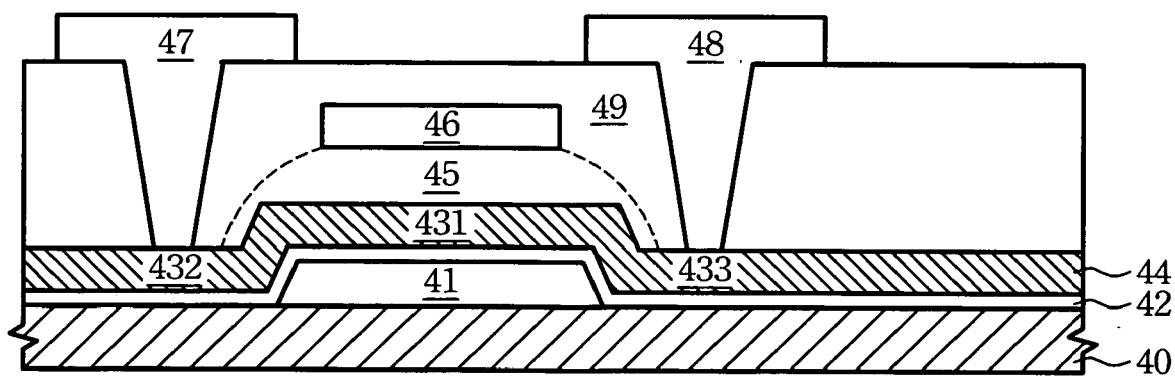
FIG. 6 is a structure of the transistor according to the present invention.

FIG. 6 is a transistor according to the present invention. The transistor is formed on the substrate 40, and includes the activated layer 41, the barrier layer 42, the poly-Si layer 44, the gate insulating layer 45, the gate metal 46, the insulating layer 49, the source metal 47 and the drain metal 48. The activated layer 41 is interposed between the substrate 40 and the barrier layer 42. The poly-Si film 44 is located on the barrier layer 42, and includes the channel region 431 on the overlap of the activated layer 41 and the barrier layer 42. The two sides of the channel region 431 are respectively the source region 432 and the drain region 433. The grain of the poly-Si layer 44 is larger than 0.4 μm. The grain boundary is in one side of the channel region 431. The gate insulating layer 45 is formed on the poly-Si film 44, and defined in the channel region 431. The gate metal 46 is separated from the poly-Si layer 44, the source metal 47 and the drain metal 48 by the gate insulating layer 45 and the insulating layer 49. The source metal 47 in the source region 432 and the drain metal 48 in the drain region are connected to the poly-Si film 44 through the two openings of the insulating layer 49.

Characteristics and advantages of the present invention are listed:

a. Improving the light transmission of the transistor by replacing SiN layer with the activated layer.
b. Reducing the crystallization energy by the low thermal conductivity of the activated layer.
c. The number of grain boundary and the homogeneity of the grain in lateral crystallization are under control.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A method for forming a poly-Si film, comprising:
   forming an activated layer on a substrate, wherein the activated layer includes carbon, hydrogen and silicon;
   patterning the activated layer;
   forming an amorphous silicon film on the patterned activated layer; and
   performing an annealing process to transform the amorphous silicon film into the poly-Si film, thereby forming a grain boundary of the poly-Si film above an edge of the patterned activated layer.

2. The method of claim 1, further comprising patterning the amorphous silicon film.

3. The method of claim 1, further comprising forming a barrier layer between the activated layer and the amorphous silicon film.

4. The method of claim 1, wherein the annealing process includes providing an energy density of about 150 to about 450 mj/cm2 over the amorphous silicon film.

5. The method of claim 1, wherein the activated layer includes a main molecular structure including a silicon oxide, and a branching structure including carbon atoms and hydrogen atoms.

6. The method of claim 1, wherein a portion of the amorphous silicon film in a channel region is thinner than another portion of the amorphous silicon film in a source region or in a drain region.

7. The method of claim 5, wherein the activated layer is made of MSQ.

8. A method for manufacturing a thin film transistor, comprising:
   forming an activated layer including carbon, hydrogen and silicon on a substrate;
   patterning the activated layer;
   forming an amorphous silicon film on the patterned activated layer;
   performing an annealing process to transform the amorphous silicon film into the poly-Si film, wherein the poly-Si film includes a channel region on the activated layer, a source region in one side of the channel region and a drain region in the other side of the channel region, and thereby the channel region of the poly-Si film has a grain boundary above an edge of the patterned activated layer;
   forming a gate insulating layer on the poly-Si film;
   forming a gate electrode on the gate insulating layer;
   forming an insulating layer on the gate electrode and the poly-Si film;
   forming two openings in the insulating layer corresponding to the source region and the drain region, respectively; and
   forming a source electrode and a drain electrode on the insulating layer, wherein the source electrode and the drain electrode correspond to the source region and the drain region, respectively, and are electrically connected to the poly-Si film through the two openings.

9. The method of claim 8, further comprising forming a barrier layer on the activated layer and the substrate before the step of forming the amorphous silicon film on the activated layer.

10. The method of claim 8, further comprising removing a portion of the amorphous silicon film on the activated layer.

11. The method of claim 8, wherein the step of performing an annealing process includes providing an excimer laser.

12. The method of claim 8, wherein the step of performing an annealing process includes providing an energy density of about 200 to about 400 mj/cm2 over the amorphous silicon film.

13. The method of claim 8, wherein a molecule of the activated layer includes a main structure including a silicon oxide, and a branching structure including carbon atoms and hydrogen atoms.

14. The method of claim 8, wherein a portion of the amorphous silicon film in the channel region is thinner than another portion of the amorphous silicon film in the source region or in the drain region.

15. The method of claim 13, wherein the activated layer is made of MSQ.

16. A thin film transistor comprising:
   a patterned activated layer formed on a substrate, wherein the material of the activated layer includes carbon, hydrogen and silicone;
   a poly-Si film, formed on the patterned activated layer, including a channel region, a source region in one side of the channel region and a drain region in the other side of the channel region, wherein the channel region of the poly-Si film has a grain boundary above an edge of the patterned activated layer;
   a gate insulating layer formed on the channel region of the poly-Si film;
   a gate electrode formed on the gate insulating layer;
   an insulating layer, formed on the gate electrode and the poly-Si film, having two openings respectively corresponding to the source region and the drain region;
   a source electrode formed on the insulating layer and corresponding to the source region and connected to the poly-Si film through one of the openings; and
   a drain metal formed on the insulating layer and corresponding to the drain region and connected to the poly-Si film through the other of the openings.

17. The thin film transistor of claim 16, further comprising a barrier layer covering the activated layer.

18. The thin film transistor of claim 16, wherein the poly-Si film in the channel region is thinner than that in at least one of the source region and the drain region.

19. The thin film transistor of claim 16, wherein the material of the activated layer includes an oxygen atom.

20. The thin film transistor of claim 16, wherein the poly-Si film has a grain size larger than about 0.4 μm.

21. The thin film transistor of claim 16, wherein the poly-Si film has a grain boundary located at the side of the channel region.

22. The thin film transistor of claim 16, wherein a molecule of the activated layer includes a main structure including a silicon oxide, and a branching structure including carbon atoms and hydrogen atoms.

23. The thin film transistor of claim 16, wherein the channel region of the poly-Si film is thinner than the source region or the drain region of the poly-Si film.

24. The thin film transistor of claim 19, wherein the activated layer is made of MSQ.

* * * * *